(12) United States Patent
Ruf

(10) Patent No.: US 6,238,826 B1
(45) Date of Patent: May 29, 2001

(54) APPARATUS FOR TRANSFERRING STRUCTURES

(75) Inventor: Alexander Ruf, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/477,445

(22) Filed: Jan. 4, 2000

Related U.S. Application Data

(63) Continuation of application No. PCT/DE98/01834, filed on Jul. 2, 1998.

(30) Foreign Application Priority Data

Jul. 4, 1997 (DE) .............................................. 197 25 622

(51) Int. Cl.[7] .................................. G03F 9/00; G21K 5/10
(52) U.S. Cl. ............................................ 430/5; 250/492.2
(58) Field of Search .............................. 430/5, 321, 296; 250/492.2

(56) References Cited

U.S. PATENT DOCUMENTS

| 5,358,807 | 10/1994 | Okamoto | ................................. | 430/5 |
| 6,017,658 | * 1/2000 | Rhee et al. | ............................... | 430/5 |

FOREIGN PATENT DOCUMENTS

| 195 09 903 A1 | 9/1906 | (DE) . |
| 0 707 237 A1 | 4/1996 | (EP) . |

OTHER PUBLICATIONS

International Publication No. WO 98/12603 (Völkel et al.), dated Mar. 26, 1998.
Patent Abstracts of Japan No. 05–224396 (Masao), dated Sep. 3, 1993.
"Influence of Shifter Errors on the Printability of L/S Structures Using the Alternated Phase–Shifting Design: Simulations and Experiments" (Beeck et al.), J. Vac Science Technology B 10(6), Nov./Dec. 1992, pp. 2468–2479.
"Optical Near–Field Lithography on Hydrogen–Passivated Silicon Surfaces" (Madsen), Applied Physics Letter 69 (4), Jul. 22, 1996, pp. 544–546.
Scanning Near–Field Optical Lithopgraphy (Wegscheider et al.), Thin Solid Films 264, 1995 Elsevier Science, pp. 264–267.
"Near–Field Optics: Light for the World of Nano–Scale Science" (Pohl), Thin Solid Films 264, 1995 Elsevier Science, pp. 250–254.
"Patterning of an Electron Beam Resist with a Scanning Tunnelling Microscope Operating in Air" (Kragler et al.), Thin Solid Films 264, 1995 Elsevier Science, pp. 259–263.
"Nanolithography and its Prospects as a Manufacturing Technology" (Pease), J. Vac. Science Technology B 10(1), 1992, pp. 278–285.
"Micromachined Aperture Probe Tip fpr Multifunctional Scanning Probe Microscopy" (Noell et al.), Applied Physics, Letter 70 (10), Mar. 1997, pp. 1236–1238.
"Light–Coupling Masks for Lensless, Sub–Wavelenght Optical Lithography" (Schmid et al.), 1998 American Institute of Physics, pp. 2379–2381.
"Using an Elastomeric Phase Mask for Sub–100 nm Photolithography in the Optical Near Field" (Rogers et al.), Applied Physics Letter 70 (20), 1997, pp. 2658–2660.
"Utilizing Optical Lithography in the Sub–Micron Dimensional Regime", Technical Disclosure Bulletin, vol. 33, No. 5, 1990, pp. 187–188.
"Silicon Processing for the VLSI Era" (Tauber et al.), Latice Press, California, pp. 476–489.

* cited by examiner

Primary Examiner—S. Rosasco
(74) Attorney, Agent, or Firm—Herbert L. Lerner; Laurence A. Greenberg; Werner H. Stemer

(57) ABSTRACT

An apparatus for transferring structures to a layer to be patterned. The apparatus has a base element and at least one radiation-conducting structure projecting from the base element. The radiation-conducting structure guides radiation to an exit aperture facing away from the base element and the shape of which structure is matched to that of the structure to be transferred.

23 Claims, 1 Drawing Sheet

APPARATUS FOR TRANSFERRING STRUCTURES

CROSS-REFERENCE TO RELATED APPLICATION

This is a continuation of International Application PCT/DE98/01834, filed Jul. 2, 1998, which designated the United States.

BACKGROUND OF THE INVENTION

Field of the Invention

The invention relates to an apparatus for transferring structures, a method for fabricating it and its use in the field of semiconductor technology.

In the last-mentioned field, the miniaturization of dimensions has an ever more important part to play. Work is being carried out to effect size reduction primarily in the case of memory components, in order to achieve a higher storage density. In the course of fabricating such memory components, photolithographic exposures for imaging the desired structures are of crucial importance. In particular in order to be able to achieve structure widths of below 0.25 $\mu$m, the resolution of conventional exposure methods must be considerably improved.

According to the contemporary prior art (see e.g. "Silicon Processing for the VLSI Era", Volume 1—Process Technology, S. Wolf, R. N. Tauber, Lattice Press, Sunset Beach, Calif., USA) projection masks are used for example for fabricating structures having a width of 0.35 $\mu$m. The projection masks being transferred to a wafer coated with photoresist after having their size reduced by a factor of 5 or 10 by a stepper. The resolution is in this case limited by the limits prescribed by wave optics. Diffraction phenomena and the Abbe criterion for resolution may be mentioned here. In conventional optical lithography, it is not possible to produce structures whose size is smaller than approximately the wavelength of the light used for exposure.

In order to improve the resolution and enable structure widths of below 0.25 $\mu$m to be achieved, two solution paths have been proposed in principle.

On the one hand, light of a shorter wavelength is used in order to achieve an improved resolution. An example that may be mentioned is the use of excimer lasers with a wavelength of 248, 195 or 157 nm (see e.g. "Nanolithography And Its Prospects As A Manufacturing Technology", R. F. W. Pease, J. Vac. Sci. Technol. B 10(1) 1992, 278–284). This solution approach requires a considerable outlay on equipment (excimer laser with special optics) and is correspondingly expensive. In addition, it is necessary to use special photoresists having high sensitivity to the wavelength used.

A further alternative for improving the resolution consists in the use of phase masks which lead to phase shifts by use of a targeted combination of the phase rotations of light during passage through optically transparent or partly absorbing media having different thicknesses. The constructive and destructive interference caused by the phase shifts leads to imaging having improved resolution.

However, the fabrication of such phase masks requires an extraordinarily high computational outlay in order to draft the fundamental configuration of the masks. In addition, the masks have to be optimized further by experimental findings. Thus, this way of improving the resolution is also time-consuming and expensive.

A more recent development enabling the optical resolution to be improved is the scanning probe technique, which makes use for example of STM technology (STM=Scanning Tunneling Microscopy). This technique is described for example in the reference titled "Patterning Of An Electron Beam Resist With A Scanning Tunneling Microscope Operating In Air", K. Kragler, E. Günther, R. Leuschner, G. Falk, H. von Seggern, G. Saemann-Ischenko, Thin Solid Films 264 (1995) 259–263, and in the article by R. F. W. Pease already mentioned.

The reference titled "Near-Field Optics: Light For The World Of Nano-Scale Science", D. W. Pohl, Thin Solid Films 264 (1995) 250–254, describes how the Abbe resolution limit is overcome by optical scanning near-field microscopy. In this case, a specimen surface is scanned using a thin tip having a very small optical aperture that is guided across the specimen surface with a small gap between them. The tip is generally a glass fiber on which metal has been vapor deposited. The resolution that can be achieved depends on the optical diameter of the aperture and the distance from the specimen and can be improved to below $\lambda/20$. For this purpose, however, it is necessary to accurately set the gap between the aperture and the specimen surface to a few nm, in order to ensure working in the optical near field. With the use of glass fibers, shear force detection is suitable for monitoring the distance.

Glass fiber tips of this type have also been used for exposing a structure. In this case, the tip is guided across the substrate to be exposed, e.g. a photoresist, and the latter is locally exposed. The structure widths that can be achieved are approximately 80 nm in air ("Scanning Near-Field Optical Lithography" (SNOL), S. Wegscheider, A. Kirsch, J. Mlynek, G. Krausch, Thin Solid Films 264 (1995) 264–267) and 50 nm in a vacuum ("Optical Near-Field Lithography On Hydrogen-Passivated Silicon Surfaces", S. Madsen, M. Müllenborn, K. Birkelund, F. Grey; Appl. Phys. Lett. 69 (4) (1996) 544–546). Further improvements in the resolution by improving the manufacturing method for the glass fiber tips are conceivable.

If it were attempted to expose a specimen surface using a single tip of this type, this would be extremely time-consuming and would not, therefore, be considered for continuous operation in the field of semiconductor technology. Moreover, it would be necessary to monitor the spacing by use of shear force detection in this case as well.

Moreover, the manufacturing process for the glass fiber tips is very poorly reproducible, with the result that corresponding tips having a defined optical aperture can only be obtained with difficulty. Consequently, tip arrays containing a plurality of tips can scarcely be used. Such arrays would additionally make it necessary to control the feeding of light to each of the tips separately and, moreover, to set the distance between each individual tip and the specimen surface separately. The outlay on equipment for this would be enormous.

Admittedly, a simplified method for manufacturing tips for scanning near-field microscopy is disclosed in the reference by W. Noell, M. Abraham, K. Mayr, A. Ruf, J. Barenz, O. Hollrichter, O. Marti and P. Güthner; titled "Micromachined Aperture Probe Tip for Multifunctional Scanning Probe Microscopy", Appl. Phys. Lett. 70 (1997) 1236–1238, and in Published, Non-Prosecuted German Patent Application DE 195 09 903 A. The tips are etched out of a silicon nitride layer with the aid of thin film technology. The problems described above in connection with the individual tips or tip arrays nonetheless remain.

SUMMARY OF THE INVENTION

It is accordingly an object of the invention to provide an apparatus for transferring structures that overcome the above-mentioned disadvantages of the prior art devices and methods of this general type.

With the foregoing and other objects in view there is provided, in accordance with the invention, an apparatus for transferring structures to a layer to be patterned, including:
- a base area; and
- at least one radiation-conducting structure disposed on the base area and having an exit aperture formed therein facing away from the base area and having a shape matched to that of a structure to be transferred, the at least one radiation-conducting structure guiding radiation to the exit aperture.

The object of the invention, therefore, is to provide a possible way of optically exposing substrates to be patterned in which the best possible resolution and structure widths of preferably below 350 nm can be achieved. The exposure should be able to be carried out as simply, rapidly and cost-effectively as possible and without a high outlay on equipment.

In particular, the invention relates to an apparatus or configuration which is suitable for transferring very fine structures to a substrate photolithographically. In this case, the exposure is effected using the techniques which are employed in optical scanning near-field microscopy and make it possible to overcome the optical resolution limit of the Abbe limit, by the near field of very small optical apertures being brought into the vicinity of the substrate surface. The smallest possible optical apertures are a precondition for the high resolution.

In the configuration according to the invention, which enables efficient exposure of the layers to be patterned in conjunction with an excellent resolution to be achieved, the very small apertures, which preferably have an aperture width of below 250 nm, are formed by the exit aperture or exit apertures of a radiation conductor. In an upper region facing away from a configuration base area, the radiation-conducting structure preferably has a structure width of below 250 nm.

The radiation-conducting structure preferably contains a radiation medium surrounded by a layer made of radiation-opaque material. If the radiation medium has a sufficient refractive index, however, then this can also be used without a radiation-opaque layer as a radiation-conducting structure.

If a layer made of radiation-opaque material is provided, then the exit apertures can also be defined by the layer made of radiation-opaque material. The configuration is then provided with a radiation-opaque layer on the side of the radiation-conducting structure, to be precise in such a way that exit apertures having the desired structure width remain free in the upper region of the radiation-conducting structure.

Owing to its high refractive index, silicon nitride ($Si_3N_4$) is a preferred material for the radiation medium. Further suitable materials are silicon dioxide and silicon carbide. It is particularly expedient for the radiation-transmissive material to be deposited by chemical vapor phase deposition, in particular plasma-enhanced chemical vapor deposition.

The radiation-transmissive material can be used in conjunction with a base element (support) or without one. By way of example, the radiation-transmissive material may be applied to a support that is likewise radiation-transmissive. A preferred support is composed of glass. However, it is also possible to use all customary materials that are otherwise used in the field of photolithography, provided that they fulfill the requirements of the necessary optical transmissivity.

If a support made of an optically opaque material is used, it likewise has transmission openings in the region opposite the exit apertures of the configuration or mask.

Furthermore, it is possible to use a support as a processing mount during the fabrication of the mask and to remove the support again after the completion of the mask.

A further variation consists in configuring the radiation-conducting structure as a cavity. The medium through which the exposure radiation passes between the side walls made of optically opaque material which bound the elevated structures is thus, in that case, generally air or the atmosphere in which the exposure of the substrate is carried out. However, it could also be a liquid in order to coordinate the refractive index.

A metal, in particular a plasmon-active metal such as e.g. aluminum, titanium, platinum or silver, is particularly suitable as the radiation-opaque material which covers the configuration. A preferred metal is aluminum. The metal is expediently vapor deposited or sputtered onto the mask with the radiation conductors.

The radiation-opaque material may additionally be coated, e.g. with an oxide, a carbide or a nitride. Suitable materials are, for example, silicon dioxide or silicon nitride.

The configuration according to the invention is outstandingly suitable for transferring very fine structures in a continuous method and is thus far superior to scanning tips. It is readily possible to produce structures with a structure width of below 100 nm, and the aperture width in the configuration is then correspondingly less than 100 nm. The radiation-conducting structures in the configuration according to the invention are preferably configured in such a way that their radius of curvature in the upper region facing away from the configuration base area is not greater than 50 nm.

A further advantage of the configuration according to the invention is that, in addition to apertures having an opening width of below 250 nm, it may also have apertures having an opening width of 250 nm or more. Both types of structure can be transferred to the layer to be patterned in a single exposure step by the apparatus according to the invention. Conventional structures and nanostructures can thus be produced extremely effectively and inexpensively using the mask according to the invention.

The nanostructure mask according to the invention is particularly expediently fabricated in such a way that apertures of above and below 250 nm are fabricated simultaneously or in parallel.

In addition to the size of the optical aperture, the resolution in optical scanning near-field microscopy is also determined by the distance from the specimen. In order to achieve a good resolution, the distance from the specimen must be set accurately to a few nm. In the case of the known scanning tips, the distance is monitored, as mentioned, by shear force detection. The distance between the configuration according to the invention and the layer to be patterned can also be controlled correspondingly.

Interferometric monitoring of the distance at the locations on the layer which do not have to be patterned is possible, moreover.

In a particularly preferred embodiment, however, the apparatus according to the invention is configured in such a way that the upper regions of the radiation medium project above the coating made of radiation-opaque material and serve as spacers with respect to the layer to be patterned. The height of the projection is thus expediently chosen in accordance with the distance between the mask and the layer that is required for the exposure of the substrate. For the exposure, the mask can then simply be placed onto the layer to be patterned. Complicated monitoring of the distance is not necessary.

The apparatus according to the invention can be fabricated by a method which includes the following steps:

a layer made of a radiation-transmissive material is provided;

a mask is applied to the layer made of the radiation-transmissive material;

using the mask, the layer made of the radiation-transmissive material is patterned in order to produce a radiation-conducting structure with an exit aperture facing away from a base area; and the mask is removed.

In this case, it is preferred if a layer made of radiation-opaque material is applied to the patterned layer made of the radiation-transmissive material in such a way that an exit aperture facing away from the configuration base area is preserved.

Furthermore, it is preferred if the layer made of the radiation-transmissive material is patterned by isotropic etching, with the result that the mask is undercut and the radiation medium produced has, at the exit aperture, a structure width of less than 250 nm, in particular of less than 100 nm.

A photoresist layer may advantageously be used as a mask for patterning the layer made of the radiation-transmissive material.

In this case, the mask for patterning the photoresist layer may be fabricated in a conventional manner, since the structure widths may be of the order of magnitude of above 350 nm, which can be produced with the aid of conventional exposure methods. The structure pattern corresponds to the desired structure pattern that is intended to be produced in the substrate to be treated, in a widened form. A suitable mask for exposing the photoresist during the fabrication of the apparatus according to the invention is, by way of example, a conventional chromium mask with structures having a width of above 350 nm.

The pattern of the mask may expediently be transferred to the photoresist layer by a standard photographic process, which photoresist layer has preferably been applied to the layer to be patterned. The masking structure is subsequently undercut in an isotropic wet or dry etching process, with the result that the radiation media that are etched out of the layer to be patterned have a width lying considerably below the structure width of the photomask. The structure width of the radiation media in the upper edge region thereof is preferably below 250 nm, and the radius of curvature of the edges of these radiation media is preferably not greater than 50 nm.

Reactive ion etching (RIE) may expediently be used to etch the radiation media. Suitable etching methods are known in principle to a person skilled in the art. Examples of suitable etchants that may be mentioned are fluorine-containing compounds or chlorine-containing compounds. The etching time depends for example on the nature of the masking structure and the thickness of the layer to be etched.

The etching operation may be carried out on the one hand in such a way that a continuous layer of the structured material is preserved. This continuous layer then defines the configuration base area. On the other hand, it is possible to etch the layer to be patterned to such an extent that material remains only in the region of the radiation media. The latter variant is suitable particularly in cases where the configuration base area is intended to be defined by a base element.

The optically opaque layer, which is preferably a metallic material, is expediently applied by vapor deposition or sputtering. In order to set the aperture and/or the height by which the radiation conductors project above the optically opaque layer to the desired size, the optically opaque material and/or the radiation media may be etched back in a manner known per se. The metal layer can also be sputtered back.

A further possibility for producing the exit aperture having a defined aperture width is chemical mechanical polishing (CMP) of the top side of the apparatus after the application of the optically opaque material. In this case, material is removed in the upper region facing away from the base area until the exit aperture has the desired aperture width. It is particularly preferred firstly, before the CMP treatment, to provide the optically opaque material with a further layer made of metal oxide, carbide or nitride, the metal not being restricted to the metal of the opaque layer.

The CMP treatment can be carried out selectively for the respective layers, with the result that, by way of example, the outer layer made of metal oxide, carbide or nitride is removed at a different rate from the optically opaque layer situated underneath or the radiation media. With selective removal, spacers having a defined height can be preserved. If, on the other hand, the CMP treatment is not carried out selectively, both optically opaque material and the material, enclosed by the latter, of the radiation medium and, if appropriate, metal oxide, carbide or nitride are removed. Monitoring of the distance from the substrate by the elevated structures projecting above the optically opaque material cannot, therefore, be realized in this case. By the same token, the CMP treatment affords the advantage that a highly planar configuration surface can be obtained, which greatly facilitates monitoring of the distance from the substrate to be exposed according to a conventional method such as shear force detection or interferometry.

The individual method steps described above are known in principle to a person skilled in the art, so that a more detailed explanation is not necessary here. Details concerning the individual method steps for fabricating tips or undercut structures made of silicon nitride may be found for example in the reference by A. Ruf, titled "Neue Sensoren fur die Rasterkraftmikroskopie" [New Sensors For Scanning Force Microscopy], Dissertation TH Darmstadt, Dissertations Druck Darmstadt GmbH 1996, ISDN 3-931713-04-0. The fabrication of metal-coated silicon nitride tips is described in the article by W. Noell et al., Appl. Phys. Lett. 70 (1997) 1236–1238.

If the intention is to fabricate an apparatus according to the invention in which the radiation-conducting structures are configured as cavities, initially the procedure is fundamentally the same as has been described above. In a fabrication stage after the application of the optically opaque material, for example after the production of the apertures having a defined size, however, the material enclosed in the radiation-conducting structures by the side walls made of optically opaque material is then removed. This can be done by a suitable etching operation in which the enclosed material is entirely or partly removed, thereby producing an exit aperture having a suitable size.

If the radiation-conducting structures are formed on a base element composed of an optically opaque material, corresponding transmission openings extend through the base element.

In the described case in which the radiation-conducting structures are configured as cavities, it is not necessary for the layer which is to be patterned, which is fabricated first in the method according to the invention, to be composed of an optically transmissive material.

If, on the other hand, the layer to be patterned is preserved and the radiation media are formed from the material of the layer to be patterned, an optically transmissive material is used.

The configurations according to the invention can be used like conventional chromium masks for exposing substrates from the field of semiconductor technology, but, by use of the near-field spectroscopy and the sub-wavelength apertures, very much better resolutions can be achieved and correspondingly considerably finer patterning can be carried out. Structure widths of below 100 nm are readily possible.

For the exposure, the configuration according to the invention is disposed above the layer to be patterned, e.g. a photoresist layer, and light, for example, is radiated in from the rear side of the apparatus, the light impinging through the sub-wavelength exit apertures on the layer to be patterned. In this way, it is possible to transfer patterns of a defined type and size to the layer to be patterned in one exposure step. The small gap—necessary in the field of is optical near-field spectroscopy—between the aperture and the layer to be patterned may be maintained either in a conventional manner, e.g. by shear force determination, or with the aid of the radiation media configured as spacers. In the latter case, the mask is placed directly onto the layer to be patterned. This variant additionally has the advantage of protecting the apertures against mechanical damage and of enabling very easily reproducible monitoring of the gap and hence exactly reproducible exposures. Moreover, with the use of the configuration according to the invention, it is possible to dispense with expensive lasers, as are used for example in DUV lithography (DUV=Deep Ultraviolet), for the exposure.

Conventional apparatuses and methods can be used both for the fabrication of the configuration according to the invention and for its use. Computational outlay, as in the case of the fabrication of phase masks, is not necessary. Furthermore, the apparatus according to the invention can also be used to produce very fine structures situated close together, as are present e.g. in DRAM cell arrays. Structures of this type can be fabricated even when, during the production of the apparatus according to the invention, there is not sufficient space remaining for undercutting between two webs or holes during the fabrication of a masking structure. In this case, it is possible to utilize the periodicity of the structure to be exposed and to effect multiple exposure one after the other using the same configuration, the apparatus according to the invention being offset by the required lattice spacing the second time. The apparatus can be displaced in a manner known per se, e.g. with the aid of a displacement table with a displacement unit monitored interferometrically.

Other features which are considered as characteristic for the invention are set forth in the appended claims.

Although the invention is illustrated and described herein as embodied in an apparatus for transferring structures, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
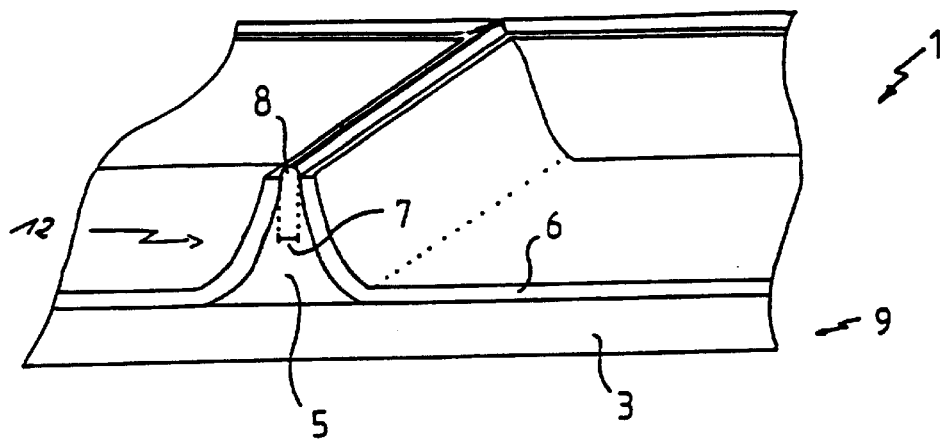
FIG. 1 is a diagrammatic, partial perspective view of an apparatus according to the invention.

In all the figures of the drawing, sub-features and integral parts that correspond to one another bear the same reference symbol in each case. Referring now to the figures of the drawing in detail and first, particularly, to FIG. 1 thereof, there is shown an apparatus or mask 1 according to the invention. The apparatus 1 contains an optically transmissive base element 3, which extends entirely over a configuration base area 9 and is in this case a glass plate on which are formed radiation media 5 composed of silicon nitride. On a side of the radiation media 5, the nanostructure mask 1 is coated with an optically opaque, but preferably plasmon-active material layer 6, in this case aluminum. Surface waves can form in the case of plasmon-active materials, as a result of which additional radiation is guided to an exit aperture 8. The radiation media 5 and the layer 6 covering them form a radiation-conducting structure 12.

The radiation media 5 are not coated with aluminum in their upper region, with the result that the exit apertures 8 having an aperture width 7 of below 250 nm are formed. The radiation media 5 project somewhat beyond the aluminum layer 6 and can serve as spacers if the structures—which are linear in this case—of the apparatus according to the invention are intended to be transferred to a photoresist layer or the like. For this purpose, the apparatus 1 according to the invention is placed, with the exit apertures 8 in a direction of the photoresist, directly onto the latter, as a result of which the apertures 8 are situated at a desired distance from the resist.

FIGS. 2 to 6 illustrate a method for fabricating an apparatus according to the invention.

Figure 2:
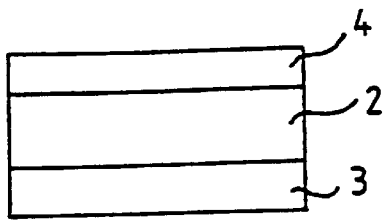
FIGS. 2 to 6 are sectional views of a method for fabricating the apparatus.

FIG. 2 shows a cross section through a starting material with the base element 3 made of the optically transmissive material, in this case glass, on which a layer made of optically transmissive silicon nitride 2 and a photoresist layer 4 have been deposited in a manner known per se.

Figure 3:
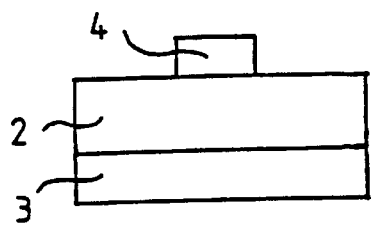
Figure 4:
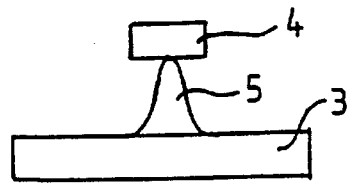

FIG. 3 illustrates a subsequent stage in which the photoresist layer 4 has been patterned in a conventional manner, e.g. by exposure using a chromium mask.

The silicon nitride layer is then etched in the subsequent step. According to the invention, the photoresist layer 4 is undercut in the process, with the result that, of the layer 2 that can be patterned, the radiation conductors 5 are preserved whose structure width is smaller than the width of the photoresist structures and is below 250 nm.

Figure 5:
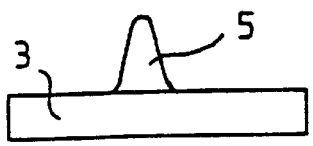

FIG. 5 shows a further stage, in which the photoresist 4 is removed.

Figure 6:
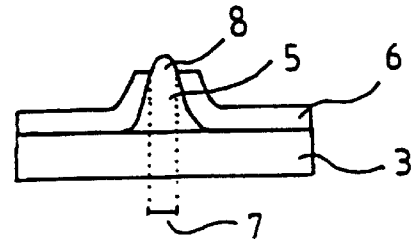

Finally, FIG. 6 shows the configuration according to the invention after the application of the optically opaque layer 6, in this case made of aluminum. The layer 6 is applied in such a way that, on the one hand, an aperture width 7 of below 250 nm is achieved and, on the other hand, the height with which the radiation media 5 project above the metal layer 6 essentially corresponds to the desired distance between the aperture 8 and the surface of the substrate which is intended to be exposed with the aid of the nanostructure mask. Optionally, a further layer 20 made of a metal oxide, a carbide or a nitride (i.e. the metal not being restricted to the metal of the opaque layer) is applied to the optically opaque layer 6.

I claim:

1. An apparatus for transferring structures to a layer to be patterned, comprising:
   a base area; and
   at least one radiation-conducting structure disposed on said base area and having an exit aperture formed therein facing away from said base area and having a shape matched to that of a structure to be transferred, said at least one radiation-conducting structure including a radiation conducting medium extending into said exit aperture for guiding radiation to said exit aperture and including a radiation opaque layer laterally bounding said radiation conducting medium.

2. The apparatus according to claim 1, wherein said radiation-opaque layer contains a metal.

3. The apparatus according to claim 2, wherein said metal is one of vapor-deposited on and sputtered on.

4. The apparatus according to claim 2, wherein said metal is selected from the group consisting of aluminum, titanium, platinum and silver.

5. The apparatus according to claim 1, including a layer made of a material selected from the group consisting of an oxide, a carbide and a nitride is applied to said radiation-opaque layer.

6. The apparatus according to claim 1, wherein said at least one radiation-conducting structure has a cavity formed therein.

7. The apparatus according to claim 1, wherein said base area is formed of a base element.

8. The apparatus according to claim 1, wherein said exit aperture has a structure width in predetermined regions of said at least one radiation conducting structure of less than 250 nm.

9. The apparatus according to claim 7, wherein said base element is formed of a radiation-transmissive material.

10. The apparatus according to claim 1, wherein said at least one radiation-conducting structure, in predetermined regions of said exit aperture, has an edge radius of curvature of not more than 50 nm.

11. The apparatus according to claim 1, wherein in a region of said exit aperture, said radiation medium projects with respect to said radiation-opaque layer to such an extent that a height of said radiation medium not covered by said radiation-opaque layer substantially corresponds to a desired exposure distance.

12. The apparatus according to claim 1, wherein said radiation medium is formed of a material selected from the group consisting of silicon nitride, silicon carbide and silicon dioxide.

13. The apparatus according to claim 1, wherein said radiation-opaque layer is a plasmon-active layer.

14. The apparatus according to claim 1, wherein said exit aperture has a structure width in predetermined regions of said at least one radiation-conducting structure of less than 100 nm.

15. A method for fabricating an apparatus for transferring structures to a layer to be patterned, which comprises:

providing a base element;

providing a layer made of a radiation-transmissive material on the base element;

applying a mask to the layer made of the radiation-transmissive material;

patterning the layer made of the radiation-transmissive material by isotropic etching, resulting in the mask being undercut and the production of a radiation-conducting structure having sides and a top;

removing the mask; and applying a further layer made of a radiation opaque material on the sides of radiation-conducting structure while leaving the top of radiation-conducting structure uncovered to form an exit aperture.

16. The method according to claim 15, wherein the exit aperture has a structure width of less than 250 nm.

17. The method according to claim 16, which comprises etching the layer made of the radiation-transmissive material via reactive ion etching.

18. The method according to claim 17, which comprises applying another layer made of a material selected from the group consisting of an oxide, a carbide and a nitride to the further layer made of the radiation-opaque material.

19. The method according to claim 15, which comprises producing the exit aperture by chemical mechanical polishing.

20. The method according to claim 15, which comprises setting a height of those regions of the radiation-conducting structure which project beyond the further layer formed of the radiation-opaque material by etching back the radiation-conducting structure.

21. The method according to claim 15, which comprises setting a height of those regions of the radiation-conducting structure which project beyond the further layer formed of the radiation-opaque material by one of etching back and sputtering back the further layer.

22. The method according to claim 15, which comprises providing a base element defining the base area and the layer made of the radiation-transmissive material is provided on the base element.

23. The method according to claim 15, which comprises patterning the layer made of the radiation-transmissive material by isotropic etching, resulting in the mask being undercut and the radiation conducting structure having a radiation medium with the exit aperture, and a structure width of the exit aperture being less than 100 nm.

* * * * *

UNITED STATES PATENT AND TRADEMARK OFFICE
CERTIFICATE OF CORRECTION

PATENT NO. : 6,238,826 B1
DATED : May 29, 2001
INVENTOR(S) : Alexander Ruf

Page 1 of 1

It is certified that error appears in the above-identified patent and that said Letters Patent is hereby corrected as shown below:

<u>Title page,</u>
Item [30] should read as follows:

-- Jul. 4, 1997 [DE] .......... 197 28 662.3 --

Signed and Sealed this

Second Day of April, 2002

Attest:

JAMES E. ROGAN
Attesting Officer
Director of the United States Patent and Trademark Office